(12) United States Patent
Yeh

(10) Patent No.: US 7,841,883 B2
(45) Date of Patent: Nov. 30, 2010

(54) LAND GRID ARRAY SOCKET CONNECTOR

(75) Inventor: Cheng-Chi Yeh, Tu-Cheng (TW)

(73) Assignee: Hon Hai Precision Ind. Co., Ltd., Taipei Hsien (TW)

(*) Notice: Subject to any disclaimer, the term of this patent is extended or adjusted under 35 U.S.C. 154(b) by 0 days.

(21) Appl. No.: 12/577,750

(22) Filed: Oct. 13, 2009

(65) Prior Publication Data

US 2010/0093201 A1   Apr. 15, 2010

(30) Foreign Application Priority Data

Oct. 14, 2008   (TW) .................................. 97139282

(51) Int. Cl.
H01R 13/62 (2006.01)
(52) U.S. Cl. ..................................... 439/330
(58) Field of Classification Search ................. 439/330, 439/331, 342, 71, 532, 536, 73
See application file for complete search history.

(56) References Cited

U.S. PATENT DOCUMENTS

| | | | |
|---|---|---|---|
| 7,001,197 B2 | 2/2006 | Shirai et al. | |
| 7,025,603 B2 * | 4/2006 | Ma | 439/73 |
| 7,402,065 B1 * | 7/2008 | Polnyi | 439/331 |
| 7,404,728 B2 * | 7/2008 | Mar | 439/331 |
| 7,614,900 B1 * | 11/2009 | Polnyi | 439/342 |
| 7,699,636 B2 * | 4/2010 | Ma et al. | 439/331 |
| 2008/0057751 A1 * | 3/2008 | Zhang | 439/73 |

* cited by examiner

*Primary Examiner*—Jean F Duverne
(74) *Attorney, Agent, or Firm*—Andrew C. Cheng; Wei Te Chung; Ming Chieh Chang

(57) ABSTRACT

A socket connector (1), used for receiving a CPU (central processing unit), includes an insulative housing (11) defining a plurality of passageways (113), a plurality of electrical contacts (14) received in the passageways, a metallic reinforcing plate (10) receiving the insulative housing, a cover member (12) pivotally mounted to the reinforcing plate, and a lever (13) attached to the reinforcing plate, pivotally driving the cover member to move toward the insulative housing. The lever rotates along a same direction as the cover member.

5 Claims, 4 Drawing Sheets

LAND GRID ARRAY SOCKET CONNECTOR

BACKGROUND OF THE INVENTION

1. Field of the Invention

The present invention relates generally to an LGA (land grid array) socket connector, and more particularly to a lever-type LGA socket connector preventing overstress to an insulative housing thereof and keeping perfect electrical connection between the LGA socket connector and a PCB (printed circuit board).

2. Description of Related Arts

U.S. Pat. No. 7,001,197 issued to Shirai et al. on Feb. 21, 2006 discloses an LGA (land grid array) socket connector comprising an insulative housing and a plurality of contacts received in the insulative housing. The insulative housing has a top surface for receiving an LGA package. A cover member is pivotally mounted on a first end of the insulative housing. The cover member extends between the first end and the second end of the insulative housing. The cover member is pivotal between an open position and a closed position and the cover member presses the LGA package toward the top surface of the insulative housing at the closed position so that the LGA package electrically connects to the contacts. An L-shaped lever is pivotally mounted on a second end of the insulative housing. The lever has a locking portion located at the second end of the insulative housing for locking the cover member in the closed position. A reinforcing plate is positioned on a bottom surface of the insulative housing. The reinforcing plate extends between the first end and the second end of the insulative housing, too. An interlocking element is laterally formed at a sidewall of the reinforcing plate. The lever is locked by the interlocking element when the cover member is at the closed position. Because the cover member and the lever are pivotally mounted on two opposite ends of the insulative housing, and the lever presses the cover member in the closed position, which induces the insulative housing to undertake overstress at two opposite ends. The insulative housing is caused to wrap and the solder balls of the LGA socket connector are destroyed from being coplanar, the electrical connection between the LGA socket connector and the PCB is destroyed, accordingly.

Hence, an LGA socket connector preventing overstress to an insulative housing thereof and keeping perfect electrical connection between the LGA socket connector and a PCB is desired.

SUMMARY OF THE INVENTION

Accordingly, an object of the present invention is to provide an LGA socket connector preventing overstress to an insulative housing thereof and keeping perfect electrical connection between the LGA socket connector and a PCB.

To achieve the above object, a socket connector, used for receiving a CPU (central processing unit), includes an insulative housing defining a plurality of passageways, a plurality of electrical contacts received in the passageways, a metallic reinforcing plate receiving the insulative housing, a cover member pivotally mounted to the reinforcing plate, and a lever attached to the reinforcing plate, pivotally driving the cover member to move toward the insulative housing. The lever rotates along a same direction as the cover member.

Other objects, advantages and novel features of the invention will become more apparent from the following detailed description when taken in conjunction with the accompanying drawings.

DETAILED DESCRIPTION OF THE PREFERRED EMBODIMENT

Figure 1:
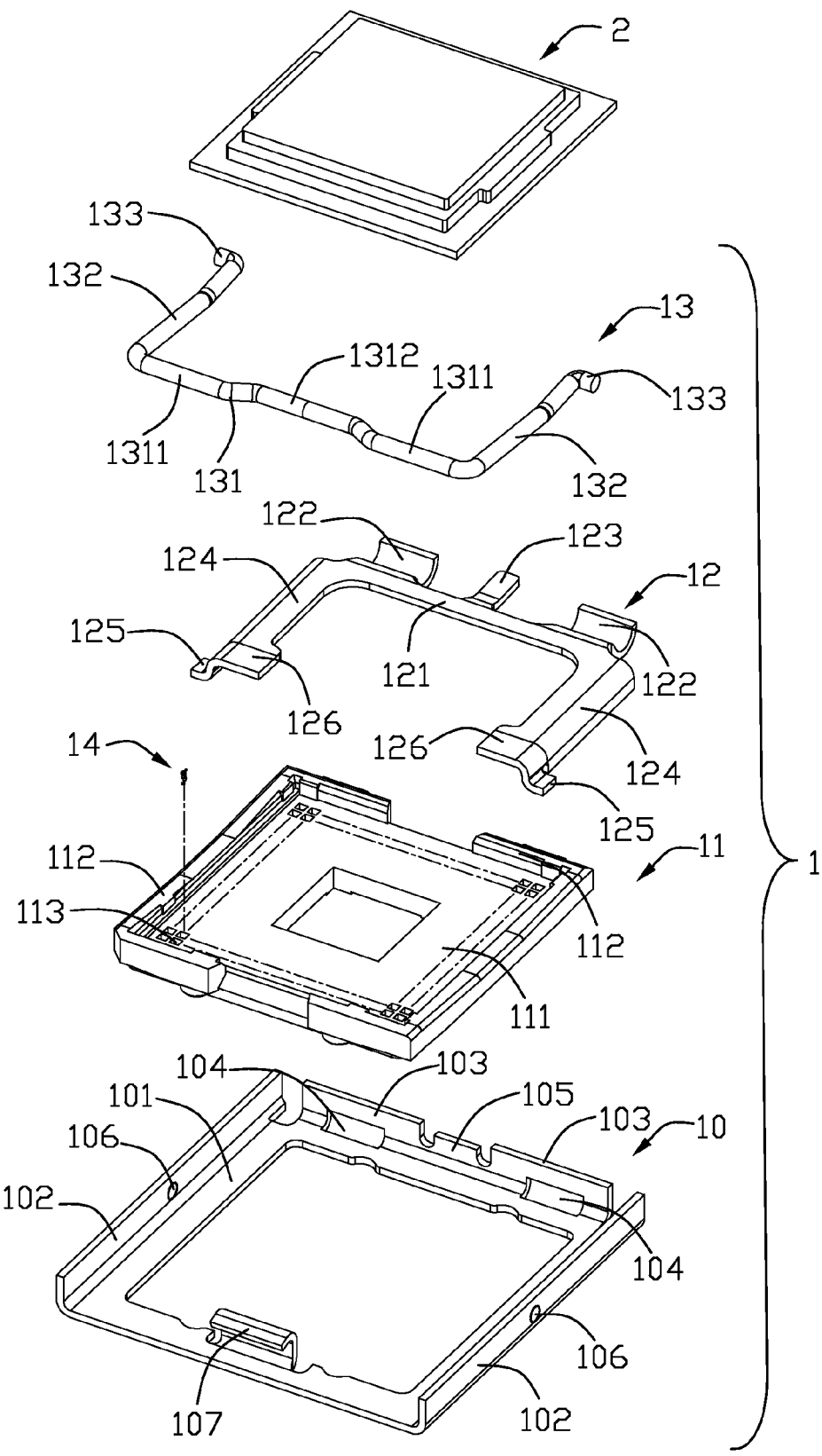
FIG. 1 is a perspective, exploded view of an LGA socket connector constructed in accordance with the present invention.
Figure 2:
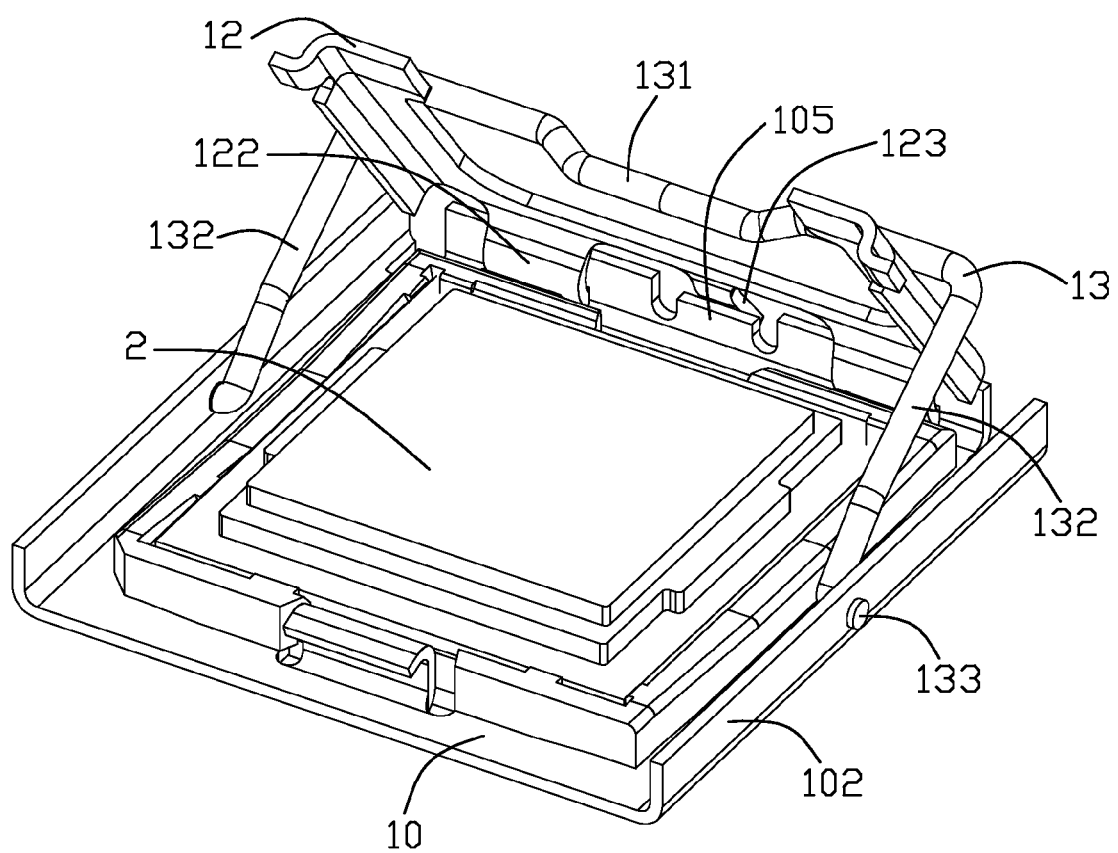
FIG. 2 is a perspective, assembled view of the LGA socket connector when the cover member is at the open position.
Figure 3:
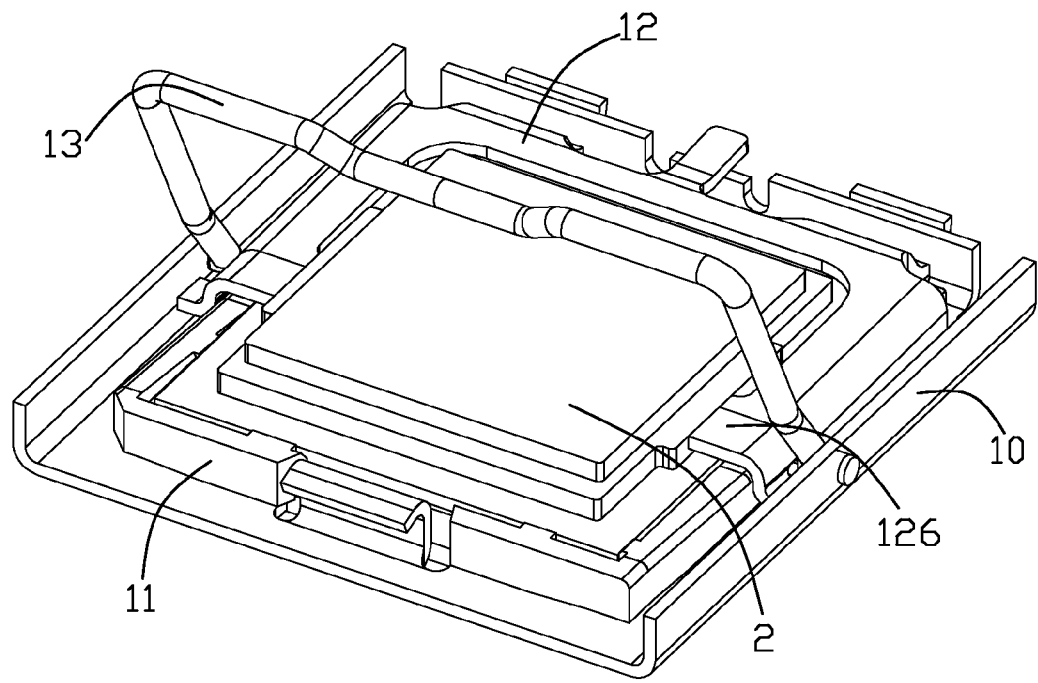
FIG. 3 is a perspective, assembled view of the LGA socket connector when the cover member is pivoted by the lever from the open position toward a closed position.
Figure 4:
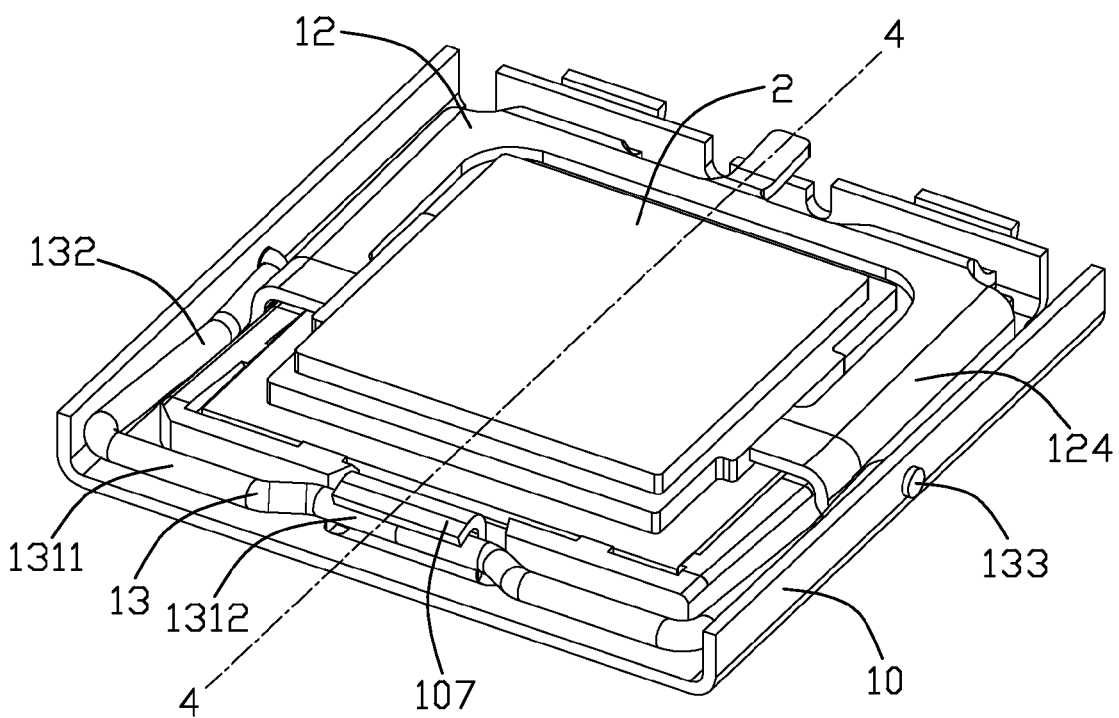
FIG. 4 is a perspective, assembled view of the LGA socket connector when the cover member is at the closed position.

Referring to FIGS. 1-4, an LGA socket connector 1 of the present invention, used for connecting a CPU (central processing unit) 2 with a PCB (printed circuit board, not shown), comprises an insulative housing 11, a plurality of electrical contacts 14 received in the insulative housing 11, a cover member 12 positioned on a top surface of the insulative housing 11, a metallic reinforcing plate 10 positioned on a bottom surface of the insulative housing 11 and a lever 13 attached to the reinforcing plate 10, pivotally driving the cover member 12 to move toward the top surface of the insulative housing 11 for receiving the CPU 2.

Referring to FIG. 1, the insulative housing 11 is rectangular configured and eudipleural i.e. symmetrical relative to a central axis 4-4 passing through a middle portion thereof The insulative housing 11 comprises a main portion 111 and a plurality of peripheral walls 112 extending upwardly from the main portion 111. The main portion 111 defines a plurality of passageways 113 for receiving he electrical contacts 14. The insulative housing 11 defines a top surface for receiving the CPU 2 and a bottom surface opposite to the top surface.

Referring to FIG. 1, the reinforcing plate 10 is positioned on a bottom surface of the insulative housing 11 and extends from a first end to a second end of the insulative housing 11. The reinforcing plate 10 is frame shaped and eudipleural along the central axis 4-4, too. The reinforcing plate 10 comprises a base portion 101, a pair of lateral walls 102 and a front wall 103 bending upwardly from out edges of the base portion 101. The lateral walls 102 and the front wall 103 extend beyond the top surface of the insulative housing 11. The front wall 103 defines a pair of cutouts 104, each spaced away from the other. The front wall 103 further forms a supporting portion 105 midway between the cutouts 104. Each lateral wall 102 defines an aperture 106 in the middle thereof, i.e. each aperture 106 has a same distance to the front edge and the rear edge of the base portion 101. Moreover, the reinforcing plate 10 forms a hook portion 107 curvedly bending from the front edge of the base portion 101 and back against the supporting portion 105. Take a plane view, the hook portion 107 and the cutouts 104 are located on two opposite sides of the apertures 106. The reinforcing plate 10 defines a receiving space for the insulative housing 11.

Referring to FIG. 1, the cover member 12, positioned on the top surface of the insulative housing 11, is eudipleural along the central axis 4-4, too. The cover member 12 is pivotally mounted on a first end of the reinforcing plate 10 and extends at least more than half dimension of the insulative housing 11 from the first end, in a preferred embodiment, the cover member 12 extends just a little more than the distance between the aperture 106 and the front edge of the base portion 101. The cover member 12 comprises an elongated arm 121 and a pair of wing arms 124 extending respectively and backwardly from the elongated arm 121 to figure as a conversed "U". The cover member 12 further comprises a pair of bearing pads 122 extending curvedly and forwardly from the front edge of the elongated arm 121. The bearing pads 122 are spaced from each other to correspondingly receive in the cutouts 104 of the reinforcing plate 10 and pivotally rotatable in the cutouts 104. A holding element 123 is formed midway between the bearing pads 122 and presses against the supporting portion 105 for preventing the cover member 12 from being over-pivoted. The wing arms 124 comprise a pair of locked pieces 126 extending inwardly from a free end thereof Each locking piece 126 forms a curved piece 125 extending downwardly and outwardly therefrom.

Referring to FIGS. 1-4, the lever 13 is U-configured and eudipleural along the central axis 4-4, too. The lever 13 comprises an operating shaft 131 and a pair of actuating shafts 132 extending laterally and forwardly from the operating shaft 131. Each actuating shaft 132 forms a pivot stick 133 at the free end thereof. The pivot sticks 133 are correspondingly received in the apertures 106 and pivotally rotatable in the apertures 106. When the cover member 12 is in an open position, the lever 13 harnesses over the cover member 12 with the operating shaft 131 positioned upside of the cover member 12. The CPU 2 is placed in the insulative housing 11 when the cover member 12 is in the open position. Following, the lever 13 is pivotally rotated, the actuating shafts 132 press against the curved pieces 125 to drive the cover member 12 from the open position to a closed position. The operating shaft 131 comprises a locking portion 1312 in the middle thereof to form engagement with the hook portion 107 when the cover member 12 is in the closed position. The pivotal rotation of the lever 13 takes along a same direction to that of the cover member 12.

Because the pivot sticks 133 of the lever 13 is attached to a middle part of the reinforcing plate 10 instead of a first end of the reinforcing plate 10, the LGA socket connector 1 prevents overstress to the insulative housing 11, therefore, the insulative housing 11 is prevented from wrapping to make sure the solder balls under the insulative housing 11 in coplanar. Perfect electrical connection between the LGA socket connector 1 and the PCB is achieved. Furthermore, the cover member 12 and the lever 13 both have minimized size and causes a cost of material.

While a preferred embodiment in accordance with the present invention has been shown and described, equivalent modifications and changes known to persons skilled in the art according to the spirit of the present invention are considered within the scope of the present invention as described in the appended claims.

What is claimed is:

1. A socket connector, used for receiving a CPU (central processing unit), comprising:
    an insulative housing defining a plurality of passageways;
    a plurality of electrical contacts received in the passageways;
    a metallic reinforcing plate receiving the insulative housing;
    a cover member pivotally mounted to the reinforcing plate; and
    a lever attached to the reinforcing plate, pivotally driving the cover member to move toward the insulative housing;
    wherein the lever rotates along a same direction as the cover member; wherein the lever comprises an operating shaft, a pair of actuating shafts extending from the operating shaft and a pair of pivot sticks at the free ends of the actuating shafts; wherein the reinforcing plate defines a pair of apertures pivotally receiving the pivot sticks; wherein the reinforcing plate forms a hook portion and the operating shaft of the lever comprises a locking portion engaged with the hook portion; wherein the cover member comprises an elongated arm and a pair of wing arms extending from the elongated arm to form a "U" shape; wherein the wing arms of the cover member extend to a middle portion of the insulative housing; wherein each wing arm forms a curved piece extending therefrom and the actuating shafts press against the curved pieces;
    wherein the wing arms comprise a pair of locked pieces extending inwardly.

2. The socket connector as described in claim 1, wherein the elongated arm has a pair of bearing pads extending therefrom.

3. The socket connector as described in claim 2, wherein the reinforcing plate defines a pair of cutouts pivotally receiving the bearing pads.

4. The socket connector as described in claim 3, wherein the reinforcing plate forms a supporting portion and the cover member forms a holding element midway between the bearing pads and pressing against the supporting portion.

5. The socket connector as described in claim 4, wherein the hook portion of the reinforcing plate is back against the supporting portion.

* * * * *